(12) United States Patent
Aggarwal et al.

(10) Patent No.: US 6,985,698 B2
(45) Date of Patent: Jan. 10, 2006

(54) IMPEDEANCE MATCHING CIRCUIT FOR A MULTI-BAND RADIO FREQUENCY DEVICE

(75) Inventors: Sudhir Aggarwal, Fremont, CA (US); Matthias Locher, San Jose, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 473 days.

(21) Appl. No.: 10/003,997

(22) Filed: Nov. 14, 2001

(65) Prior Publication Data

US 2003/0092388 A1    May 15, 2003

(51) Int. Cl.
*H04B 15/00*     (2006.01)

(52) U.S. Cl. .......................... 455/62; 455/70; 455/118; 455/255; 455/213; 333/17; 333/32; 333/33

(58) Field of Classification Search .................. 455/73, 455/78, 79, 82, 80, 83, 84, 121, 122, 123, 455/124, 125, 62, 70, 118, 225, 213; 333/100, 333/101, 17.3, 124, 32, 112, 118, 129, 17, 333/33

See application file for complete search history.

(56) References Cited

U.S. PATENT DOCUMENTS

| | | | | |
|---|---|---|---|---|
| 5,079,556 | A | * | 1/1992 | Itoh ............................ 342/109 |
| 5,448,602 | A | * | 9/1995 | Ohmori et al. ............. 375/347 |
| 5,740,524 | A | * | 4/1998 | Pace et al. ................ 455/232.1 |
| 5,969,582 | A | | 10/1999 | Boesch et al. |
| 6,002,860 | A | * | 12/1999 | Voinigescu et al. ............ 703/14 |
| 6,185,434 | B1 | * | 2/2001 | Hagstrom et al. ........ 455/552.1 |
| 6,215,988 | B1 | | 4/2001 | Matero |
| 6,242,986 | B1 | | 6/2001 | Adar |
| 6,243,566 | B1 | | 6/2001 | Peckham et al. |
| 6,292,474 | B1 | | 9/2001 | Ali et al. |
| 6,298,244 | B1 | | 10/2001 | Boesch et al. |
| 6,304,748 | B1 | | 10/2001 | Li et al. |
| 6,414,562 | B1 | * | 7/2002 | Bouisse et al. ................ 333/32 |
| 6,628,176 | B1 | * | 9/2003 | Okada .......................... 333/32 |
| 2002/0049044 | A1 | * | 4/2002 | Indseth ........................ 455/118 |
| 2002/0160738 | A1 | * | 10/2002 | Allott et al. ................. 455/304 |

FOREIGN PATENT DOCUMENTS

EP          0 772 304 A2    5/1997

OTHER PUBLICATIONS

Vladmir Aparin et al., GAAS RFICS for CDMA/AMPS Dual-Band Wireless Transmitters, 1998 IEEE Radio Frequency Integrated Circuits Syposium.
Kamal Sahota et al., A Base-Band to RF BiCMOS Transmitter RFIC for Dual-Band CMDA/AMPS Wireless Handsets, 2000 IEEE.

* cited by examiner

*Primary Examiner*—Sonny Trinh
*Assistant Examiner*—Khai Nguyen
(74) *Attorney, Agent, or Firm*—Aaron Waxler

(57) ABSTRACT

In an impedance matching circuit for a multi-band radio frequency device, a first radio frequency signal in a first sub-band of a multi-band radio frequency signal is selectively outputted. Further, a second radio frequency signal in a second sub-band of the multi-band radio frequency signal is selectively outputted. Selective outputting is done through partly shared and partly non-shared reactive elements, without the need to switch reactive elements.

17 Claims, 3 Drawing Sheets

IMPEDEANCE MATCHING CIRCUIT FOR A MULTI-BAND RADIO FREQUENCY DEVICE

BACKGROUND OF THE INVENTION

1. Field of the Invention

The present invention relates to an impedance matching circuit for a multi-band radio frequency device, and further to such multi-band radio frequency device, and an impedance matching method.

More particularly, such impedance matching is done at sub-bands of a multi-band radio frequency signal in order to match impedances between various parts of the multi-band radio device such as between amplifier stages, between mixers and amplifier stages, or the like.

2. Description of the Related Art

U.S. Pat. No. 6,243,566 discloses impedance matching for a power amplifier in a dual band transmitter for a radiotelephone. For example, such a dual band transmitter radiotelephone can use the GSM system which operates at 900 MHz, and the DCS system, which is similar to GSM except that it operates at 1800 Mhz. In a two-stage power amplifier, an inter-stage matching circuit matches the impedances between a first stage and a second stage of the two-stage power amplifier. The inter-stage matching circuit optimizes the impedances at 900 Mhz or 1800 MHz depending on which transmission mode is in use. Two field effect transistors are used as power amplifier stages. Between the stages is a 15 pF capacitance, and at the source of the first stage is a small 3 nH inductance which is connected to a voltage source. A 2.7 pF capacitance is connected between the inductance and the voltage source. A 100 pF capacitance is also connected to the voltage source with a diode connected from the 1000 pF capacitance to ground. A 1.5 kΩ resistor with an input node is connected between the 1000 pF capacitor and the diode. When a voltage source is connected to the input node, the diode turns on and the 1000 pF capacitance dominates the impedance of the interstage matching circuit. The capacitance values are calculated so that 900 GSM signals from the first stage of the power amplifier are matched to the second stage when the input node is connected to a 2.7 V positive voltage source. When a zero, negative, or floating voltage source is connected to the input node, the 2.7 pF capacitance is connected to the input node, and the 2.7 pF capacitance and the 3 nH inductance dominate the impedance of the inter-stage matching circuit which matches the 1800 MHz signals to the second stage. Thus, a voltage applied to an input node, and a diode switch determine a GSM mode or DCS mode of the impedance matching circuit. The impedance matching network, is thus shared for receiving GSM of DCS sub-band signals.

Other systems used with multi-band radio frequency devices include NMT-450 operating at 450 MHz, AMPS and DAMPS operating at 800 MHz, PCS operating at 1900 MHz, or still other systems.

SUMMARY OF THE INVENTION

It is an object of the invention to provide an impedance matching circuit for a multi-band radio frequency device with reduced complexity and no need for external mode control of the impedance matching circuit itself.

It is another object of the invention to provide such an impedance matching circuit that avoids use of switches in a signal path.

In accordance with the invention, an impedance matching circuit for a multi-band radio frequency device is provided, the impedance matching circuit comprising:

a frequency selective network comprising a first frequency selective sub-network that is configured to selectively output a first radio frequency signal comprised in a first sub-band of said multi-band radio frequency signal, and a second frequency selective sub-network that is configured to selectively output a second radio frequency signal comprised in a second sub-band of said multi-band radio frequency signal, said first and second frequency selective sub-networks being switch-less networks.

The invention is based on the recognition that frequency selection of sub-bands using partly shared frequency selective sub-networks render switches obsolete. The invention is further based on the recognition that, when implementing impedance matching networks as an integrated circuit use of switches in series or parallel to a capacitor or inductor may cause the circuit not to work under all circumstances, depending on the parasitics associated with the switches and switched components. This is because a switch in IC form has a large resistance which degrades the performance of the inductor or resistor being switched, particularly at very high frequencies.

In an embodiment of an impedance matching network according to the invention, one sub-network is formed of a common inductor coupled to an input node of the impedance network and a reference potential such as ground, and, for dual band operation, a capacitor in a series arrangement of two capacitors, and another sub-network is formed of the common or shared inductor, and another capacitor of the series arrangement. In that embodiment, the one capacitor is connected between the input node and an output node for the lower sub-band, and the other capacitor is connected to that output node and a further output node for the higher sub-band. Herewith, a very simple network is obtained that automatically passes sub-bands to the two output nodes. Because there is only one inductor rather than two, had two separate impedance networks been used, also chip area is saved. By selectively switching on/off amplifiers for various sub-bands that are coupled to the impedance matching network, when implemented in a transmitter only the desired sub-band is transmitted. This embodiment may very easily be extended to multi-band operation including more than two sub-bands. For example, for three band operation, simply a capacitor is added to the series arrangement thus creating a third output node.

The impedance matching network may be implemented to accommodate differential or single-ended circuit elements such as amplifier stages, mixers, or any other circuit element where impedance matching for multi-band operation is needed.

In another embodiment of an impedance matching network according to the invention, capacitors for sub-band selection are provided that are coupled to successive nodes of a series arrangement of inductors. However, in this parallel-capacitor implementation, more inductors are needed than in the above series-capacitor implementation.

In an embodiment of the invention, the impedance matching network is included in a transmitter path a multi-band radio frequency device, and is arranged between mixer(s) and controllable amplifiers for different sub-bands.

In another or further embodiment of the invention, the impedance matching network is included in a transmitter path a multi-band radio frequency device, and is arranged between common pre-amplifier stages and controllable non-sub-band-shared amplifiers stages for different sub-bands.

BRIEF DESCRIPTION OF THE DRAWING

Throughout the figures the same reference numerals are used for the same features.

DESCRIPTION OF THE DETAILED EMBODIMENTS

Figure 1:
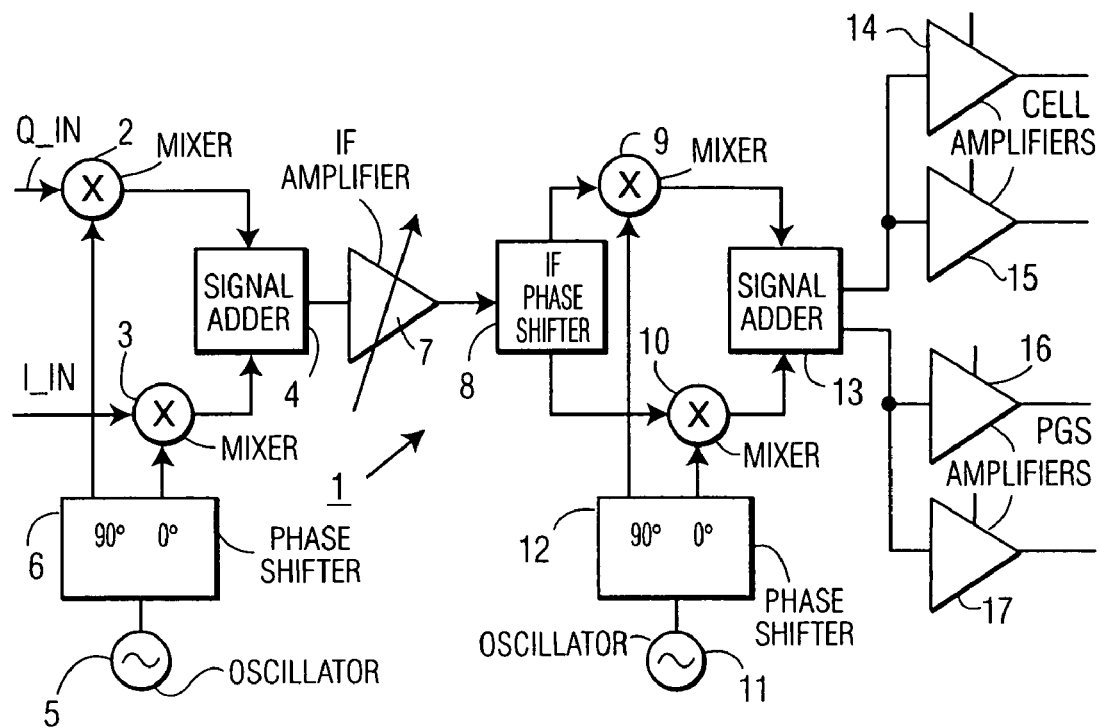
FIG. 1 is a block diagram of a multi-band radio device according to the invention.

FIG. 1 is a block diagram of a multi-band radio device 1 according to the invention. In the embodiment shown, signals are differential and quadrature. In other embodiments, signals may be single-ended and/or non-quadrature. Shown in detail is a transmitter part of radio device 1 with a pair of quadrature IF mixers 2 and 3, coupled to a signal adder 4. IF-mixers 2 and 3 mix base band signals I_IN and Q_IN with 0° and 90° phase shifted oscillator signals provided by an oscillator 5 via a phase shifter 6. At output side, signal adder 4 is coupled to an IF amplifier 7 that provides an amplified IF signal to IF phase shifter 8. IF phase shifter 8 provides differential quadrature signals to a pair of RF mixers 9 and 10 that otherwise receive phase shifted oscillator signals from an oscillator 11 via phase shifter 12. A signal adder 13 adds quadrature mixed RF signals. Further shown are controllable amplifiers 14 and 15 for a higher sub-band of the multi-band, in the example given dual band, and controllable amplifiers 16 and 17 for the lower sub-band of the multi-band, so-called PCS and CELL bands. In the example given there are two controllable amplifiers per sub-band. This is because, in transmitters, sub-bands such as PCS usually are split into two further sub-bands. Selectivity of these further sub-bands is achieved more upstream in the transmitter, by separate band pass filters (not shown in detail here). Because these further sub-bands are close to each other in frequency, there is no need to build in selection thereof in the impedance matching circuits of the invention as shown in detail in FIGS. 2–5. For selection of the PCS sub-band, amplifiers 14 and 15 are switched on and amplifiers 16 and 17 are switched off. For selection of the CELL sub-band, amplifiers 16 and 17 are switched on and amplifiers 14 and 15 are switched off.

Figure 2:
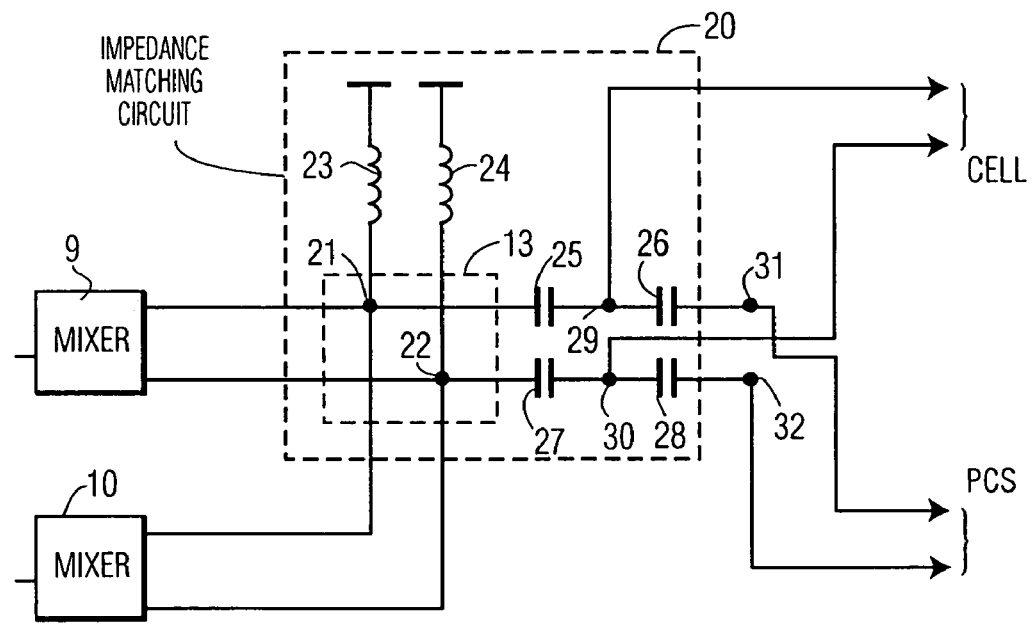
FIG. 2 shows a first embodiment of an impedance matching circuit according to the invention, coupled to a pair of quadrature mixers, for dual band operation.

FIG. 2 shows a first embodiment of an impedance matching circuit 20 according to the invention, coupled to quadrature mixers 9 and 10, for dual band operation. Signal adder 13 is implemented by connecting respective differential outputs of mixers 9 and 10 in common input nodes 21 and 22. Impedance matching network 20 comprises inductors 23 and 24 respectively being coupled between nodes 21 and 22 and ground, a series arrangement of capacitors 25 and 26 coupled to input node 21, and a series arrangement of capacitors 27 and 28 coupled to input node 22. Series arrangements of capacitors 25 and 26, and of capacitors 27 and 28, have output nodes 29 and 30 for the CELL band, and output nodes 31 and 32 for the PCS band. Capacitors 25 and 26, and 27 and 28, are dimensioned such that for the higher frequency PCS sub-band, RF signal flow effectively and substantially is via signal paths formed by capacitors 25 and 26, and 27 and 28, the other signal paths via capacitors 25 and 27 alone effectively being short-circuits, and that for the lower CELL sub-band, RF signal flow effectively and substantially is via signal paths formed by capacitors 25 and 27 alone. As compared to prior art solutions that use separate and non-shared matching circuits for dual-band, at least two mixers, an RF phase shifter are saved.

Figure 3:
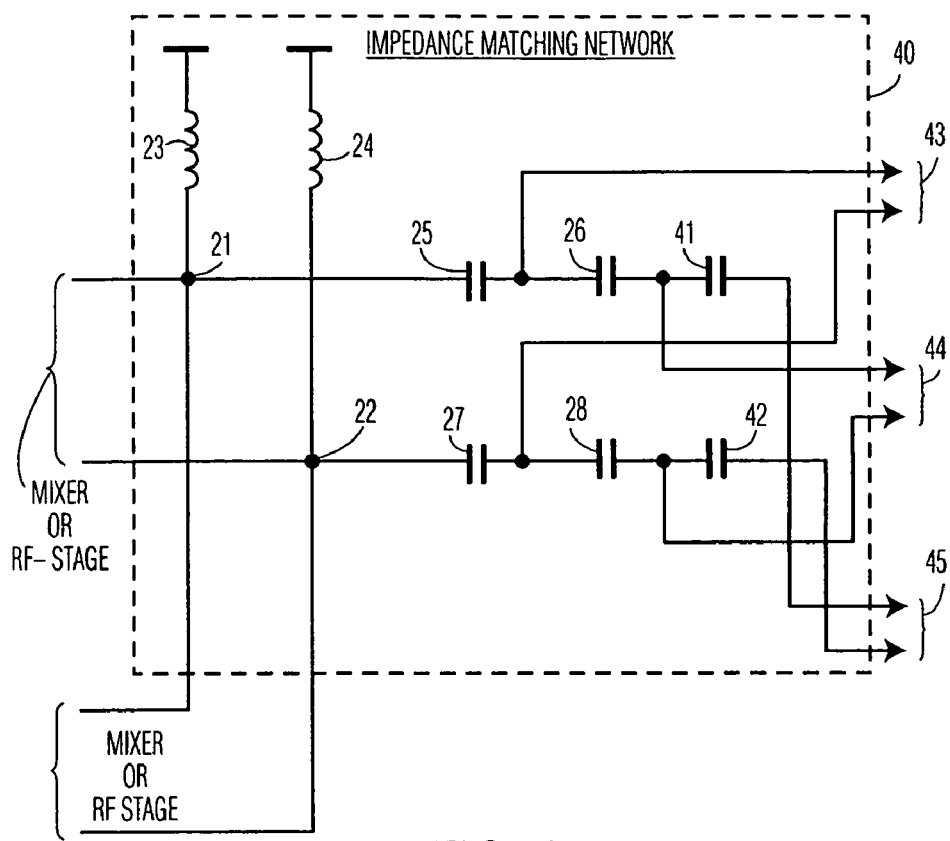
FIG. 3 shows an embodiment of an impedance matching network according to the invention, for three-band operation.

FIG. 3 shows an embodiment of an impedance matching network 40 according to the invention, for three-band operation. In addition to inductors 23 and 24, and capacitors 25, 26, 27, and 28, for three sub-band operation, impedance matching circuit 40 has capacitors 41 and 42. Herewith, differential output signals 43, 4, and 45 for three sub-bands are obtained.

Figure 4:
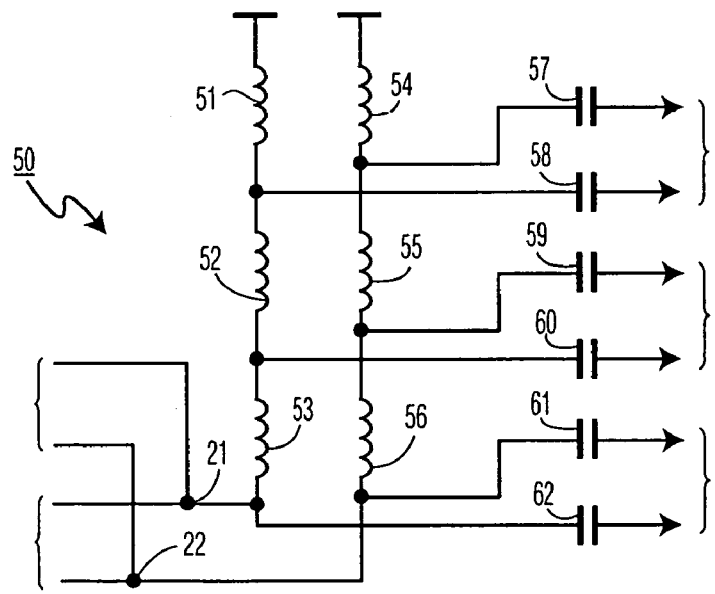
FIG. 4 shows another embodiment of an impedance matching network according to the invention.

FIG. 4 shows another embodiment of an impedance matching network 50 according to the invention. Impedance matching network 50 has a series arrangement of inductors 51, 52, and 53 between input node 21 and ground, and a series arrangement of inductors 54, 55, and 56 between input node 22 and ground. For sub-band selection of three sub-bands, capacitors 57 and 58, capacitors 59 and 60, and capacitors 61 and 62 are provided. Capacitors 57 and 58 select the highest sub-band, capacitors 59 and 60 select the mid sub-band, and capacitors 61 and 62 select the lowest sub-band.

Figure 5:
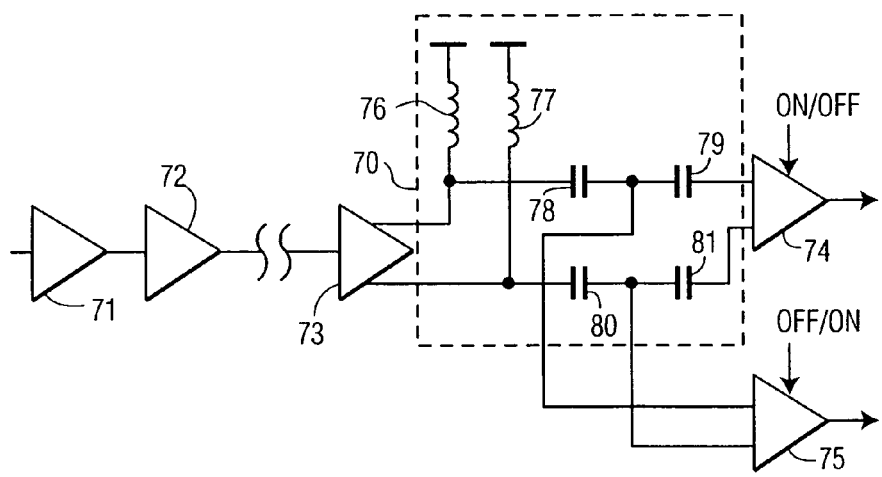
FIG. 5 shows an embodiment of an impedance matching circuit according to the invention, coupled between common pre-amplifier stages and separate amplifiers for sub-bands, for dual band operation.

FIG. 5 shows an embodiment of an impedance matching circuit 70 according to the invention, coupled between common pre-amplifier stages 71, 72, and 73, and separate amplifiers 74 and 75 for sub-bands, for dual band operation. Impedance matching circuit 70 has the same structure as impedance matching circuit 20, and comprises inductors 76 and 77, and capacitors 78, 79, 80, and 81. With one of the amplifiers 74 and 75 switched on at a time, the other one of amplifiers 74 and 75 is switched off.

In view of the foregoing it will be evident to a person skilled in the art that various modifications may be made within the spirit and the scope of the invention as hereinafter defined by the appended claims and that the invention is thus not limited to the examples provided. The word "comprising" does not exclude the presence of other elements or steps than those listed in a claim.

What is claimed is:

1. An impedance matching circuit for a multi-band radio frequency device, said impedance matching circuit comprising:

an input circuit for receiving a multi-band radio frequency signal;

a frequency selective network comprising a first frequency selective sub-network that is configured to selectively output a first radio frequency signal comprised in a first sub-band of said multi-band radio frequency signal, and a second frequency selective sub-network that is configured to selectively output a second radio frequency signal comprised in a second sub-band of said multi-band radio frequency signal, said first and second frequency selective sub-networks being switch-less networks, wherein said first and second frequency sub-network further comprises a common reactive element, said common reactive element further comprising an inductor.

2. An impedance matching network as claimed in claim 1, wherein said first frequency selective sub-network comprises a common reactive element of a first type, and a first reactive element of a second type, and said frequency selective sub-network comprises said common reactive element, and a second reactive element of said second type, said first and second reactive elements being arranged in series, said first radio frequency signal being outputted at a first node of said series arrangement and said second radio frequency signal being outputted at a second node of said series arrangement.

3. An impedance matching network as claimed in claim 1, wherein said first frequency selective sub-network comprises a series arrangement of common reactive elements of a first type, and a first reactive element of a second type, and said second frequency selective sub-network comprises said series arrangement of common reactive elements, and a second reactive element of said second type, said first reactive element being coupled between a first node of said series arrangement and a first output node for outputting said first radio frequency signal, and said second reactive element being coupled between a second node of said series arrangement and a second output node for outputting said second radio frequency signal.

4. An impedance matching network as claimed in claim 3, wherein said frequency selective network comprises a third frequency selective sub-network that is configured to selectively output a third radio frequency signal comprised in a third sub-band of said multi-band radio frequency signal.

5. An impedance matching network as claimed in claim 1, wherein the input circuit is an adder circuit.

6. An impedance matching network as claimed in claim 5, wherein the adder circuit is comprised of connected nodes for receiving signals from first and second mixer circuits.

7. An impedance matching network as claimed in claim 1, wherein the input circuit is comprised of at least one input terminal for receiving said multi-band radio frequency signal.

8. An impedance matching network as claimed in claim 7, wherein said multi-band radio frequency signal is received from a pre-amplifier stage commonly used for multi-band signal amplification, and said first and second radio frequency signals are signals for input to a first non-sub-band-shared amplifier stage configured to amplify said first radio frequency signal, and a second non-sub-band-shared amplifier stage configured to amplify said second radio frequency signal, respectively.

9. A multi-band radio frequency device with an impedance matching circuit, said impedance matching network comprising:
an input circuit f or receiving a multi-band radio frequency signal;
a frequency selective network comprising a first frequency selective sub-network that i-s configured to selectively output a first radio frequency signal comprised in a first sub-band of said multi-band radio frequency signal, and a second frequency selective sub-network that is configured to selectively output a second radio frequency signal comprised in a second sub-band of said multi-band radio frequency signal, said first and second frequency selective sub-networks being switch-less networks, wherein said first and second frequency sub-network further rises a common reactive element, said common reactive element further comprising an inductor.

10. A multi-band radio frequency device as claimed in claim 9, wherein said first frequency selective sub-network comprises a common reactive element of a first type, and a first reactive element of a second type, and said second frequency selective sub-network comprises said common reactive element, and a second reactive element of said second type, said first and second reactive elements being arranged in series, said first radio frequency signal being outputted at a first node of said series arrangement and said second radio frequency signal being outputted at a second node of said series arrangement.

11. A multi-band radio frequency device as claimed in claim 9, wherein said first frequency selective sub-network comprises a series arrangement of common reactive elements of a first type, and a first reactive element of a second type, and said second frequency selective sub0netowrk comprises said series arrangement of common reactive elements, and a second reactive element of said second type, said first reactive element being coupled between a first node for outputting said first radio frequency signal, and said second reactive element being coupled between a second node of said series arrangement and a second output node for outputting said second radio frequency signal.

12. A multi-band radio frequency device as claimed in claim 9, further comprising first and second mixer circuits, the input circuit comprising connected nodes for receiving signals from first and second mixer circuits.

13. A multi-band radio frequency device as claimed in claim 12, further comprising a first amplifier circuit for amplifying said first radio frequency signal, and a second amplifier circuit for amplifying said second radio frequency signal.

14. A multi-band radio frequency device as claimed in claim 13, wherein said impedance matching circuit, said first and second mixers, and said first and second amplifier circuits are comprised in a transmit branch of said multi-band radio frequency device.

15. A multi-band radio frequency device as claimed in claim 9, further comprising a pre-amplifier stage commonly used for multi-band signal amplification, a first non-sub-band-shared amplifier stage, and a second non-sub-band-shared amplifier stage, and a second non-sub-band-amplifier stage, wherein said input circuit comprises at least one input terminal for receiving said multi-band radio frequency signal, said first radio frequency signal being inputted to said first non-sub-band-shared amplifier stage, and said second radio frequency signal being inputted to said second non-sub-band-shared amplifier stage.

16. A multi-band radio frequency device as claimed in claim 15, wherein said second non-sub-band-shared amplifier stage is switched of t when said first non-sub-band-shared amplifier stage is switched on, and said first non-sub-band-shared amplifier stage is switched on when said first non-sub-band-shared amplifier stage is switched off.

17. A multi-band radio frequency device as claimed in claim 15, wherein said impedance matching circuit, said pre-amplifier stage, and said first and second non-cub-band-shared amplifier stages are comprised in a transmit branch of said multi-band radio frequency device.

* * * * *